US 6,566,877 B1

(12) United States Patent
Anand et al.

(10) Patent No.: US 6,566,877 B1
(45) Date of Patent: May 20, 2003

(54) BAND-LIMITED GRADIENT WAVEFORMS

(75) Inventors: Christopher K. Anand, Chesterland, OH (US); Michael R. Thompson, Cleveland Heights, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/748,499

(22) Filed: Dec. 26, 2000

(51) Int. Cl.⁷ .................................................. G01V 3/00
(52) U.S. Cl. ...................... 324/314; 324/307; 324/309; 324/320
(58) Field of Search ................................ 324/314, 307, 324/309

(56) References Cited

U.S. PATENT DOCUMENTS

| | | | |
|---|---|---|---|
| 4,307,343 A | 12/1981 | Likes | 324/307 |
| 4,651,097 A * | 3/1987 | Iwaoka et al. | 324/307 |
| 4,663,591 A * | 5/1987 | Pelc et al. | 324/309 |
| 4,698,591 A * | 10/1987 | Glover et al. | 324/307 |
| 4,769,603 A | 9/1988 | Oppelt et al. | 324/309 |
| 4,833,407 A * | 5/1989 | Holland et al. | 324/309 |
| 4,893,081 A * | 1/1990 | Zur | 324/309 |
| 4,999,580 A * | 3/1991 | Meyer et al. | 324/309 |
| 5,034,692 A | 7/1991 | Laub et al. | 324/309 |
| 5,512,825 A * | 4/1996 | Atalar et al. | 324/303 |
| 5,519,320 A * | 5/1996 | Kanayama et al. | 324/309 |
| 5,541,514 A | 7/1996 | Heid | 324/309 |
| 5,668,474 A | 9/1997 | Heid | 324/309 |
| 5,722,410 A * | 3/1998 | NessAiver | 324/309 |
| 5,899,858 A * | 5/1999 | Muthupillai et al. | 324/307 |

* cited by examiner

Primary Examiner—Edward Lefkowitz
Assistant Examiner—Dixomara Vargas
(74) Attorney, Agent, or Firm—Fay, Sharpe, Fagan, Minnich & McKee, LLP

(57) ABSTRACT

A subject is disposed in an imaging region (10) of a magnetic resonance imaging apparatus. An operator submits a series of user preferences to the apparatus. A gradient optimizer (82) generates a gradient waveform that is optimal for the imaging procedure based on the user submitted specifications and the apparatus hardware specifications. The optimizer (82) accesses a memory that stores ideal gradient waveform models. The model that best fits the user specifications is selected and digitized (84). The digitized waveform is then convolved (86) with a band-limited kernel (88) that represents a frequency spectrum (89) of a gradient amplifier (28), producing a gradient waveform (90) that is smooth and does not exceed the capabilities of the amplifier. This optimized waveform is used in an imaging process including a collected data reconstruction portion of the process.

24 Claims, 4 Drawing Sheets

BAND-LIMITED GRADIENT WAVEFORMS

BACKGROUND OF THE INVENTION

The present invention relates to the diagnostic imaging arts. It finds particular application in conjunction with magnetic resonance imaging gradient waveforms and will be described with particular reference thereto. It is to be appreciated that the present invention is also applicable to other types of waveform generation and is not limited to the aforementioned application.

In magnetic resonance imaging, a uniform main magnetic field is created through an examination region in which a subject to be examined is disposed. With open magnetic resonance systems, the main magnetic field is vertical, perpendicular to the subject. With classical bore systems, the main magnetic field is along the head to foot horizontal axis of a prone subject. A series of radio frequency (RF) pulses and magnetic field gradients are applied to the examination region to excite and manipulate magnetic resonances. Gradient magnetic fields are conventionally applied to encode spatial position and other information in the excited resonance.

The gradient fields are applied during an imaging sequence and typically treated mathematically as trapezoidal waveforms. Ideally, read gradient waveforms have a steep leading ramp which instantaneously transitions to a constant value for data sampling. After sampling, the gradient ramps steeply back to zero or to another value. As a practical matter, it is difficult to design a continuous waveform with sharp corners. Typically, these ideal waveforms are approximated by using sinusoidal waveforms with high frequency components to simulate corners. To generate such waveform corners, high voltages at high frequencies are needed. Equipment needed to generate such waveforms adds to system complexity and expense. Such waveform generation also increases the probability of gradient spiking, degrading the quality of the output image.

As stated before, it is difficult to construct a corner, i.e., a point whose derivative is undefined, out of a continuous waveform. Such waveforms have characteristic overshoots that oscillate to the desired value. Graphically, this manifests in a squiggle where a sharp corner should be. Typically, data is taken only during the portion of the waveform that is constant. This is done to avoid artifacts due to information being placed in incorrect regions of k-space. Such a data collection scheme is inefficient, as it is not utilizing the whole time frame of gradient activity.

The present invention provides a new and improved method and apparatus that overcomes the above referenced problems and others.

SUMMARY OF THE INVENTION

In accordance with one aspect of the present invention, a magnetic resonance imaging apparatus is given. A main magnet assembly produces a main magnetic field in an imaging region. An RF assembly excites and manipulates magnetic resonance. Gradient amplifiers drive gradient coils which spatially encode the magnetic resonance. A gradient optimizer optimizes gradient waveforms based on user input and hardware specifications. A reconstruction processor reconstructs received resonance.

In accordance with another aspect of the present invention, a method of magnetic resonance imaging is given. An imaging sequence is selected in which an RF pulse, a read gradient pulse, and at least one other gradient pulse are included. The read gradient is sampled and convolved with a band limited kernel matched to the gradient/amplifier system frequency response spectrum. The sequence is applied to generate magnetic resonance data, and the data is reconstructed into an image representation.

According to another aspect of the present invention, a method of diagnostic imaging is given. A subject is disposed in a main magnetic field of a magnetic resonance apparatus. An optimum gradient waveform is constructed and used in an imaging process where magnetic resonance is excited and received. The magnetic resonance is reconstructed and converted into an image representation.

According to another aspect of the present invention, a gradient optimizer is given. The gradient optimizer includes a model archive, a kernel generator, a spectrum memory, and a convolution circuit.

According to a more limited aspect of the present invention, the gradient optimizer can be utilized in new or pre-existing magnetic resonance systems.

One advantage of the present invention is the efficient reading of imaging data.

Another advantage is that it minimizes gradient spiking.

Another advantage is that it is backwardly compatible to existing systems.

Another advantage is improved gradient waveform fidelity for arbitrary types of k-space trajectories.

Another advantage is that it requires less computation for the design of the pulsed waveform (equivalently polygonal k-space trajectory).

Another advantage is the elimination of analog low-pass filters, reducing delay and increasing performance.

Another advantage is the elimination of numerical errors arising from interpolation, integration, and/or differentiation of sampled waveforms.

Yet another advantage is the efficiency of storing and transmitting the compact pulsed waveform representation.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
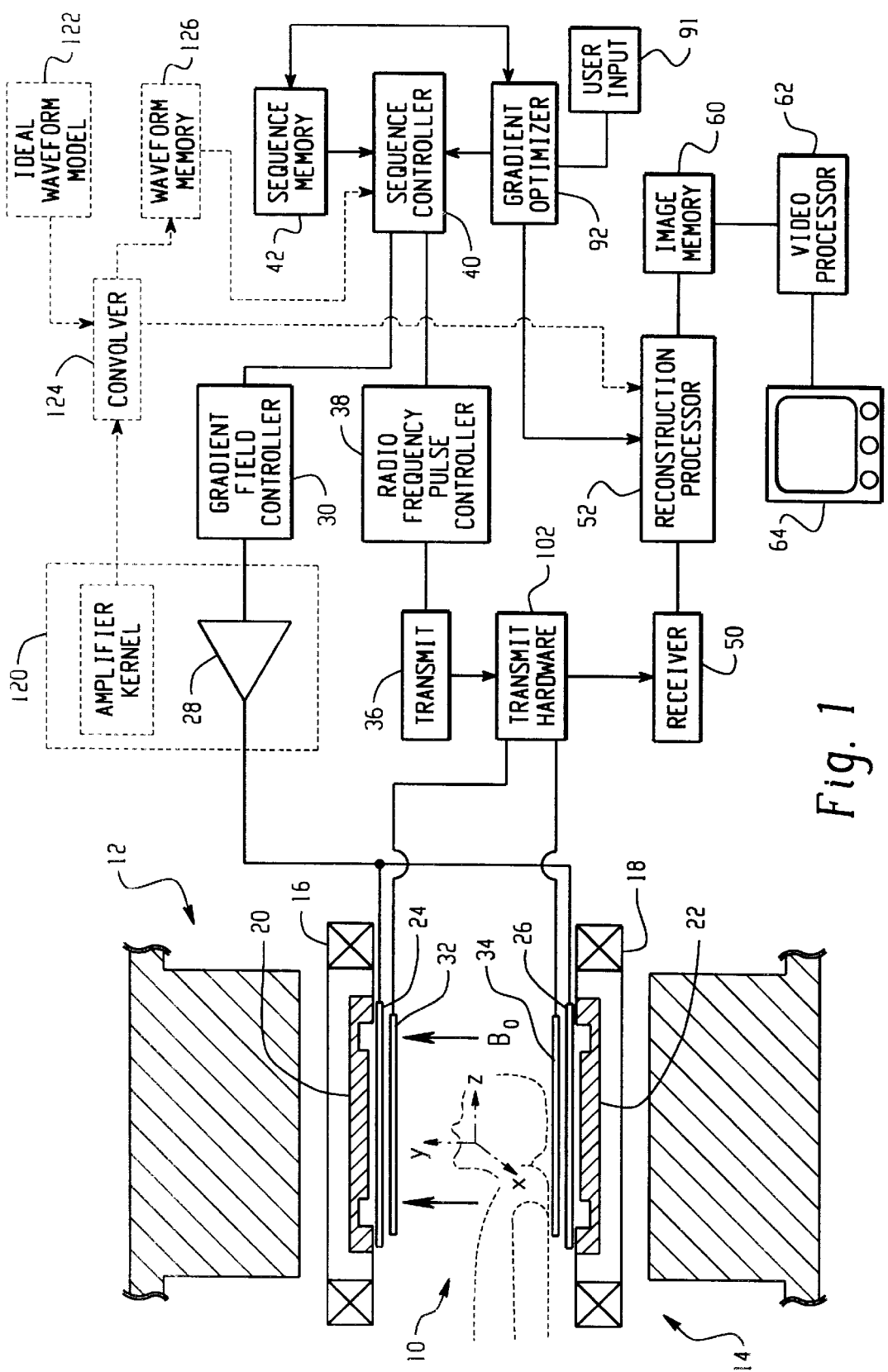
FIG. 1 is a diagrammatic illustration of an MRI apparatus in accordance with the present invention, including an alternate upgrade embodiment ghosted.

With reference to FIG. 1, although an open MRI system is illustrated by way of example, it is to be appreciated that the present invention is equally applicable to bore type magnets. An imaging region 10 is defined between an upper pole assembly 12 and a lower pole assembly 14. A pair of annular super-conducting magnets 16, 18 surround upper and lower pole pieces 20, 22 generating a temporally constant, main magnetic field $B_0$ through the imaging region 10. It is to be appreciated that the open MRI apparatus may have a variety of pole pieces or, in some instances, no pole pieces at all. Optionally, a ferrous flux return path is provided between the pole assemblies remote from the imaging region 10.

For imaging, magnetic field gradient coils 24, 26 are disposed on opposite sides of the imaging region 10 adjacent the pole pieces 20, 22. In the preferred embodiment, the gradient coils are planar coil constructions which are connected by gradient amplifiers 28 to a gradient magnetic field controller 30. The gradient amplifiers, by design, have a defined frequency response spectrum. The gradient magnetic field controller 30 causes current pulses which are applied to the gradient coils such that gradient magnetic fields are superimposed on the temporally constant and uniform field $B_0$ across the imaging region 10. The gradient fields are typically generated along a longitudinal or y-axis, a vertical or z-axis and a transverse or x-axis.

In order to excite magnetic resonance in selected dipoles of a subject disposed in the imaging region 10, radio frequency coils 32, 34 are disposed between the gradient coils 24, 26 and the imaging region 10. At least one radio frequency transmitter 36, preferably a digital transmitter, causes the radio frequency coils to transmit radio frequency $B_1$, magnetic field pulses requested by a radio frequency pulse controller 38 to be transmitted into the imaging region 10. A sequence controller 40, under operator control, retrieves an imaging sequence from a sequence memory 42. The sequence controller 40 provides the selected sequence information to the gradient controller 30 and the radio frequency pulse controller 38 such that radio frequency and gradient magnetic field pulses in accordance with the selected sequence are generated.

These RF pulses are used to induce and manipulate magnetic resonance in the subject. Resonance data is demodulated by one or more receivers 50, preferably digital receivers. The digitized demodulated signals or data lines are reconstructed by a reconstruction processor 52 into volumetric, slice, or other image representations. Preferably, a Fourier transform or other appropriate reconstruction algorithm is utilized. The image representations are stored in a volumetric image memory 60. A video processor 62, under operator control, withdraws selected image data from the volume memory and formats it into appropriate data for display on a human readable display 64, such as a video monitor, active matrix monitor, liquid crystal display, or the like.

Figure 2:
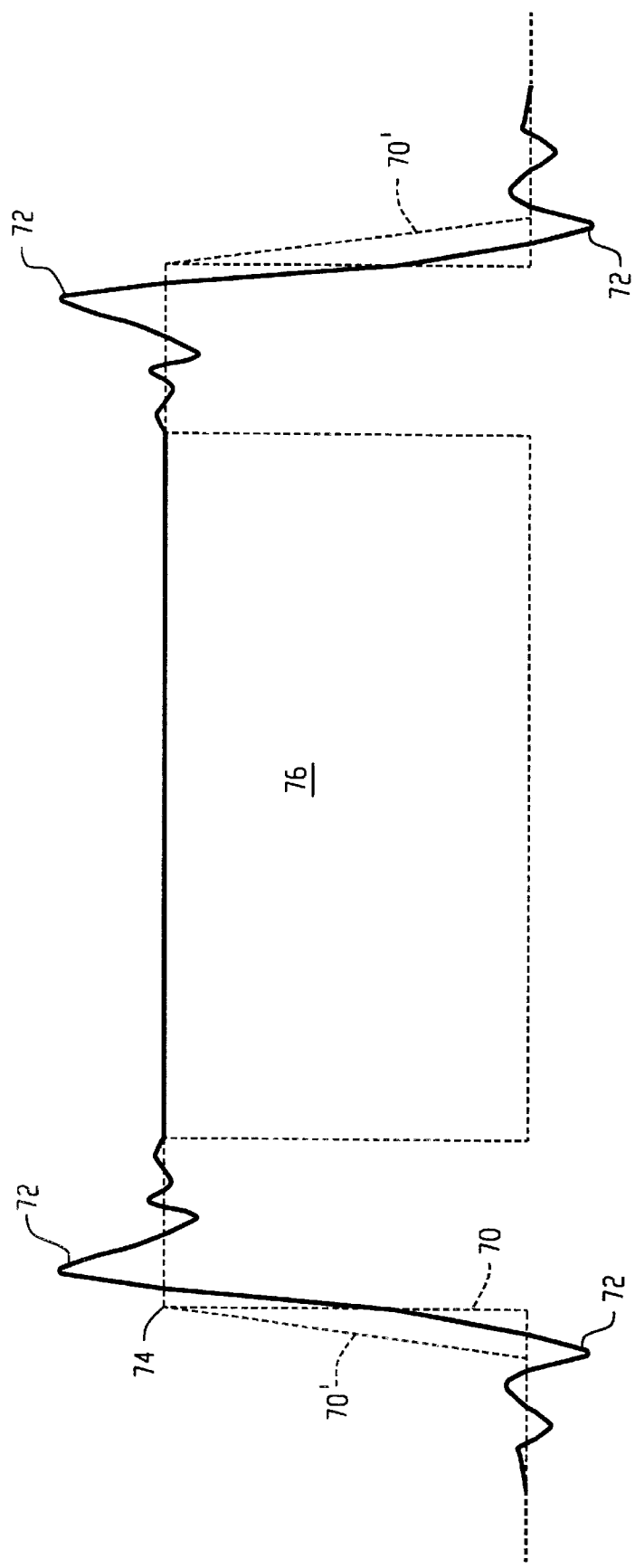
FIG. 2 is a continuous function representation of a gradient pulse overlaying an ideal gradient pulse.

The ideal gradient waveform is that of a square pulse 70 as illustrated in FIG. 2. Because instantaneous amplitude changes are not practical, the sides of the pulse are typically ramped 70' to define a trapezoid. When trying to reproduce this pulse with a continuous waveform, a characteristic overshoot 72 occurs at the corner 74 where the derivative of the square pulse 70 is undefined. The instability at the corners is attributable to the gradient amplifiers having a frequency response that lacks the extremely high frequencies needed to make sharp corners. This allows data to be collected in a constant region 76 where the waveform behaves as it is intended. The actual amplitude of the gradient defines the location of the corresponding point in k-space. If data is collected during the overshoot 72, the gradient does not have the expected amplitude and the reconstruction processor will attribute the collected data to the k-space location corresponding to the expected amplitude, resulting in misplaced data.

Figure 3:
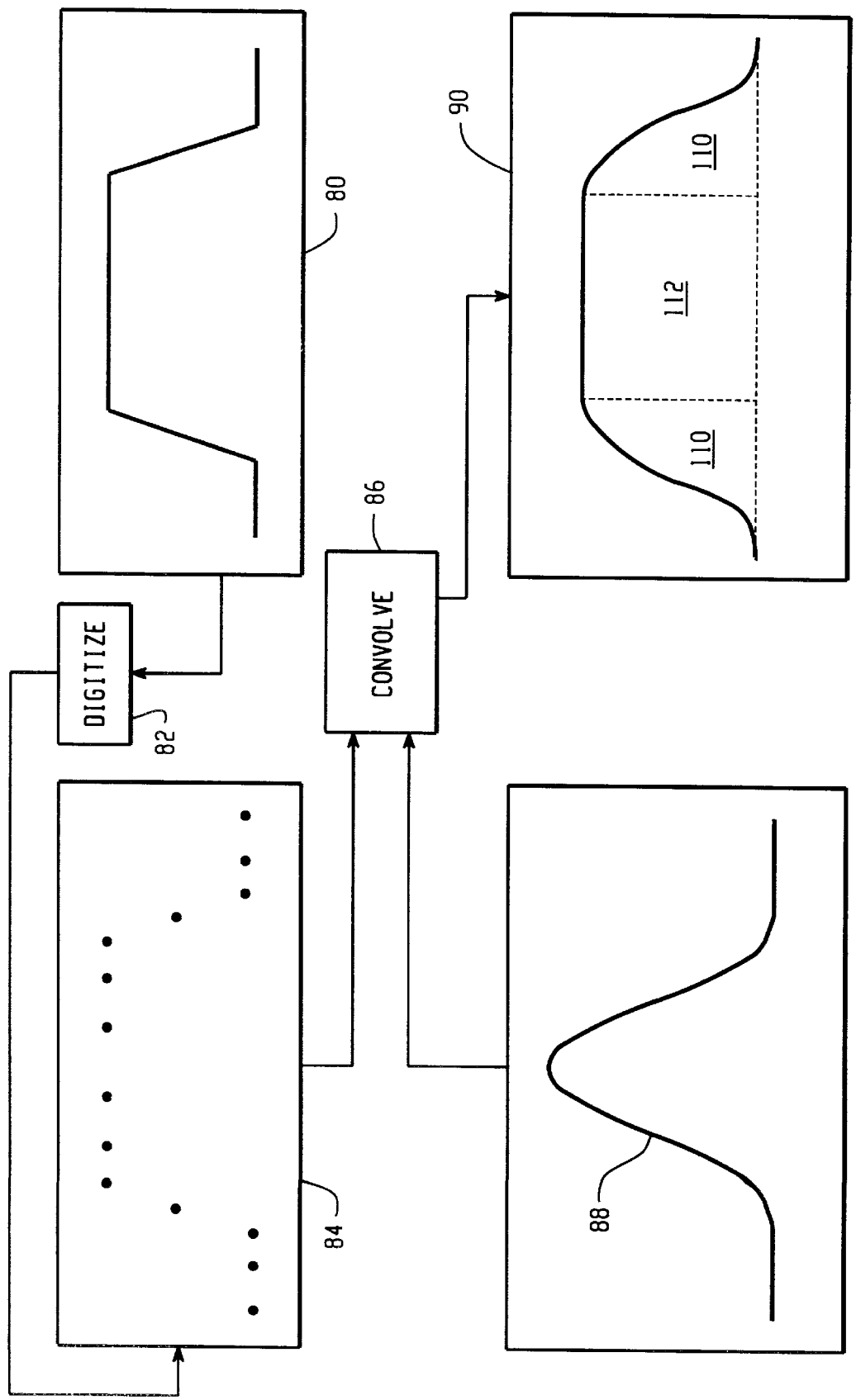
FIG. 3 is a flow diagram of a modified waveform generation.

With reference to FIG. 3, a selected ideal gradient waveform 80 is digitized 82. Preferably, the input waveform is sampled sparsely as compared to normal data sampling rates, e.g. about every 16 µs. The digitized waveform 84 (essentially a series of impulses or δ-functions) is then convolved 86 with a band-limited kernel 88 matched to a useable portion of a frequency response spectrum of the gradient amplifier 28 and the transmit coils 24, 26. This yields a modified waveform 90 specifically tailored to the hardware specifications of the gradient amplifier 28. This yields a waveform which is as close to the original waveform that the selected gradient amplifiers can produce without overshoot. To provide a safety margin, the frequency spectrum curve 88 is narrowed from the optimal theoretical spectrum for the selected amplifiers. The spectrum is optionally narrowed to avoid hardware resonance frequencies, phase distorted regions near edges of the spectrum, and the like.

Figure 4:
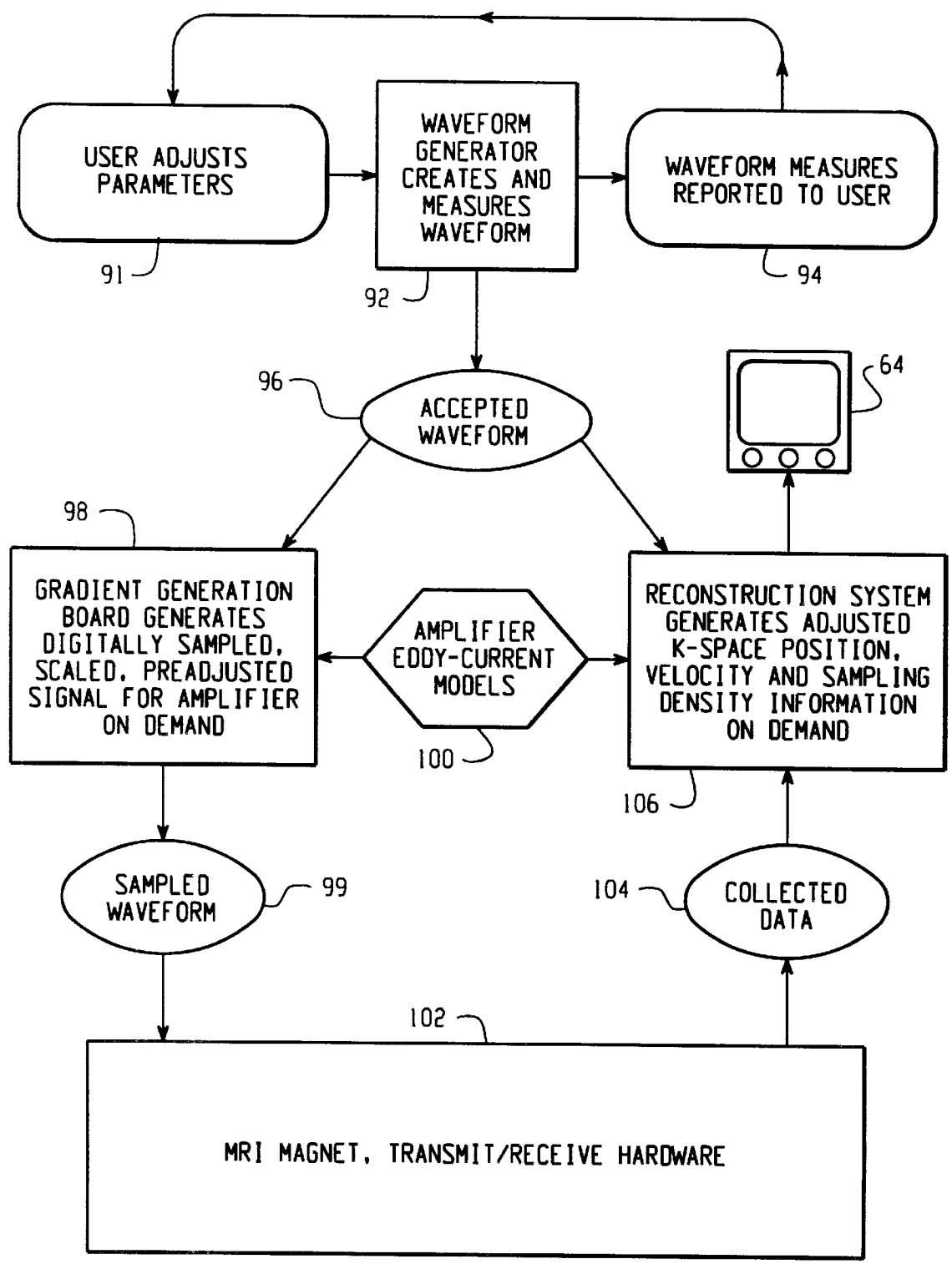
FIG. 4 is a flowchart of a typical imaging process in accordance with the present invention.

In the preferred embodiment, a waveform is designed that allows data collection over the timespan of the whole read gradient waveform. With reference to FIG. 4, an operator enters a set of input parameters 91 that defines the type of image acquisition to be performed. Some parameters that are selected are the desired field of view, preferred k-space trajectories, the resolution of the output image(s), maximum scan time, maximum dB/dt, etc. Of course, the extent of operator control is not limited to these examples. A number of variables in addition to these could also be treated as independent and controlled by the operator.

In the preferred embodiment, the operator enters a set of input parameters based on the type of acquisition being performed. A gradient and sequence optimizer 92 generates a pulsed waveform (equivalently a polygonal trajectory through k-space) based on the input parameters. The optimizer 92 also calculates dependant variables including minimum repeat time, minimum echo time, readout time, sampling efficiency, etc. The calculated values are then displayed 94 to the operator, allowing the operator to interactively adjust the sequence. If the entered parameters are outside the safe operating limits, this is also signaled. When the operator is satisfied with the entered parameters, the operator submits 96 the accepted waveform to the scanner. This causes the pulsed waveform, and other parameters to be submitted to the sequence controller 40, the sequence memory 42, and the reconstruction processor 52.

In the preferred embodiment, the pulsed waveform 96 is transmitted to both the sequence controller 40/98 and reconstruction processor 52/106. Both subsystems use the pulsed waveform, the band-limited kernel 88, and an amplifier/gradient model 100 to define an adjusted continuous waveform which is sampled at the required hardware sampling rates. A first sampled waveform 99 is transmitted to the transmit hardware 102. A second sampled waveform is generated internally by the reconstruction processor 52 in a step 106, as the collected data 104 is processed. The hardware sampling rates for transmit and receive may vary independently, as required. The gradient amplifier 28 drives the gradient coils 24, 26 of the magnet. The RF coils 32, 34 transmit pulses and receive resonance echo signals generated in the patient. Resonance data is digitally sampled at the hardware sampling rate, collected 104, and transmitted to the reconstruction system. The resonance data is then reconstructed 106 by the reconstruction processor 52.

In the preferred embodiment, the data transmitted to the reconstruction processor 52 is corrected before reconstruction. That is, the reconstruction processor 52 uses the pulsed waveform and the ideal model to define a continuous trajectory through k-space. The continuous trajectory and its derivatives are sampled at the hardware sampling rate and used in reconstruction. With reference to FIG. 3, the data collected under sloped side lobes 110 is not sampled linearly in k-space as the data collected under a flat center section 112 is. This data can be resampled or mapped to a constant velocity linear k-space sampling, and subsequently processed conventionally.

A number of advantages are recognized as a result of modifying the gradients in this manner. One is that the risk of gradient spiking is minimized. The new waveform is within the range of the capabilities of the gradient amplifier 28, because the frequency spectrum is taken into account. Moreover, the exact form of the gradient is known, so data can be taken over the entire waveform. To this end, the modified gradient waveform is passed to the reconstruction processor 52 before imaging commences so appropriate corrections can be made during reconstruction. Further, since the gradient waveform is specifically tailored to the current machine specifications, this embodiment is compatible with existing machines as well as new ones.

The preferred embodiment as described produces waveforms with small high-frequency components. Generally, gradient amplifiers act as low pass filters and become unstable with a signal that has many high frequency components. By eliminating most high frequency components in the waveform design, waveform shape integrity is insured. This would not be the case if some combination of analog filtering and gradient tube inductance were relied upon to remove the components.

In an alternate embodiment of the present invention, the representation of the waveform can be used for other gradient waveforms, for example, gradients used in conjunction with RF excitations, velocity encoding gradients, and velocity compensation gradients. Improved performance will result for any gradient whose precise shape and timing are important.

In another alternate embodiment, periods of constant gradient activity and repeated subwaveforms can be represented in the pulsed waveform by macros to reduce memory requirements.

In an alternate, gradient amplifier upgrade embodiment, as ghosted in FIG. 1, software and possibly hardware elements are added to existing systems. The software includes a gradient frequency spectrum memory 120 which holds information about the frequency spectrum of the gradient amplifier system in the form of its kernel 88. The upgrade also adds an ideal waveform memory 122 which stores the ideal gradient waveform defining points 84, a convolver 124, and additional software for the gradient optimizer 92 and reconstruction processor 52. Once the waveforms of a sequence to be implemented have been optimized, these continuous band-limited waveforms are sampled at the rate required by the existing sequence controller 40 and reconstruction subsystem 52. The scanner functions as in the previously discussed preferred embodiment, plus module changes for compatibility with the pre-existing system.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance imaging apparatus comprising:
   a main magnet assembly that produces a main magnetic field in an imaging region, wherein is disposed a subject;
   an RF coil assembly that excites and manipulates magnetic resonance of selected dipoles in the imaging region;
   a gradient coil assembly that spatially encodes the magnetic resonance;
   gradient amplifiers that have a limited bandwidth;
   a gradient means for optimizing gradient waveforms for compatibility with the bandwidth of the gradient amplifiers and other frequency limiting requirements; and,
   a reconstruction processor that reconstructs received resonance into an image representation.

2. The magnetic resonance imaging apparatus as set forth in claim 1, wherein the gradient optimizing means includes:
   a model archive which stores models of ideal gradient waveforms.

3. The magnetic resonance imaging apparatus as set forth in claim 2, wherein the gradient optimizing means includes:
   a digitizer that samples the ideal gradient waveform at a hardware clock speed to produce a digitized ideal gradient waveform.

4. The magnetic resonance imaging apparatus as set forth in claim 3, wherein the gradient optimizing means includes:
   a spectrum memory which stores a model of a frequency response spectrum of the gradient amplifiers.

5. A magnetic resonance imaging apparatus comprising:
   a main magnet assembly that produces a main magnetic field in an imaging region, wherein is disposed a subject;
   an RF coil assembly that excites and manipulates magnetic resonance of selected dipoles in the imaging region;
   a gradient coil assembly that spatially encodes the magnetic resonance;
   gradient amplifiers;
   a gradient optimizer that optimizes gradient waveforms based on user input parameters, ideal waveform models, and hardware specifications, the gradient optimizer including:
      a model archive wherein are stored models of ideal gradient waveforms;
      a digitizer that samples the ideal gradient waveform at a hardware clock speed to produce a digitized ideal gradient waveform;
      a spectrum memory wherein is contained a model of a frequency response spectrum of the gradient amplifiers;
      a gradient synthesizing circuit that:
         selects one of the ideal gradient waveform models based on user input parameters;
         convolves the digitized ideal gradient waveform model with the frequency response spectrum model of the gradient amplifiers to produce an optimal gradient waveform; and,
   a reconstruction processor that reconstructs received resonance into an image representation.

6. The magnetic resonance imaging apparatus as set forth in claim 5, wherein:
   the ideal waveform models each include a series of digital values along the ideal waveform; and, the frequency response spectrum model includes a kernel corresponding to the frequency response spectrum of the gradient amplifiers.

7. The magnetic resonance imaging apparatus as set forth in claim 5, wherein the reconstruction processor includes:
a gradient waveform sub-memory that stores the optimal gradient waveform.

8. The magnetic resonance imaging apparatus as set forth in claim 7, wherein the reconstruction processor includes an adjustment circuit that:
compares the optimal gradient waveform with the ideal gradient waveform;
determines a deviance of the optimal gradient waveform from the ideal gradient waveform; and,
adjusts received resonance signals according to the deviance.

9. The magnetic resonance imaging apparatus as set forth in claim 8, wherein the reconstruction processor includes a reconstruction algorithm that reconstructs the adjusted resonance signals into an image representation.

10. The method as set forth in claim 9, wherein the step of band limiting the gradient waveform includes:
selecting an imaging sequence which includes at least a radio frequency magnetic field pulse, a read gradient pulse, and at least one other gradient pulse;
sampling a selected read gradient at intervals to generate a series of gradient values;
convolving the selected gradient values with a preselected band-limited kernel which represents a frequency response spectrum of the gradient amplifier that applies the read gradient to generate a modified read gradient waveform.

11. The method as set forth in claim 10, further including:
selecting a plurality of imaging sequences;
sampling the read gradients from each of the sequences to generate a series of gradient values;
convolving the gradient values with the preselected band-limited kernel to generate a plurality of modified read gradient waveforms;
storing the modified read gradient waveforms;
accessing the stored read gradient waveforms when applying a selected imaging sequence.

12. A method of diagnostic imaging comprising:
disposing a subject in a main magnetic field of a magnetic resonance apparatus;
constructing an optimum gradient waveform by:
selecting an imaging sequence which includes at least a radio frequency magnetic field pulse, a read gradient pulse, and at least one other gradient pulse;
sampling a selected read gradient at intervals to generate a series of gradient values;
convolving the selected gradient values with a preselected band-limited kernel which represents a frequency response spectrum of a gradient amplifier that applies the read gradient to generate a modified read gradient waveform;
exciting magnetic resonance and receiving magnetic resonance signals;
applying the optimum gradient waveform with a gradient amplifier during a resonance signal read portion of an imaging sequence by amplifying the optimum gradient waveform with gradient amplifiers that have a frequency response spectrum that is not greater than the frequency response spectrum represented by the kernel;
reconstructing the read magnetic resonance signals and converting them to an image representation of an interior of the subject.

13. The method as set forth in claim 12, further including:
replacing the gradient amplifiers with gradient amplifiers with a second frequency response spectrum;
repeating the convolving step using a kernel corresponding to the second frequency response spectrum.

14. The method as set forth in claim 10, further including:
sampling the other gradient pulses; and,
convolving the sampled other gradient pulses with the band-limited kernel.

15. A method of diagnostic imaging comprising:
disposing a subject in a main magnetic field of a magnetic resonance apparatus which includes gradient coils connected with bandwidth limited gradient amplifiers;
band limiting gradient waveforms such that the compressed gradient waveforms are compatible with bandwidths of the bandwidth limited amplifiers;
exciting magnetic resonance and receiving magnetic resonance signals;
supplying the compressed gradient waveforms to the gradient amplifiers during a resonance signal read portion of an imaging sequence;
reconstructing the read magnetic resonance signals and converting them to an image representation of an interior of the subject.

16. The method as set forth in claim 15, wherein the step of band limiting the gradient waveform includes:
submitting scan preferences to the apparatus from a user;
choosing an ideal gradient waveform based on the scan preferences;
digitizing the ideal waveform; and,
convolving the digitized ideal waveform with a band-limited kernel representing a frequency spectrum of a gradient amplifier.

17. The method as set forth in claim 15, wherein the step of reconstruction includes:
adjusting the read resonance signals based on the band limited gradient waveform;
applying a reconstruction sequence to convert the resonance data into an image representation.

18. A magnetic resonance imaging apparatus comprising:
a means for receiving a subject in a main magnetic field of a magnetic resonance apparatus;
a means for selecting an ideal gradient waveform;
a means for converting the ideal gradient waveform into an optimum gradient waveform tailored to a specific gradient amplifier;
a means for exciting magnetic resonance and receiving magnetic resonance signals;
a means for applying the optimum gradient waveform with the gradient amplifier during a resonance signal read portion of an imaging sequence in which resonance signals are read;
a means for determining a difference between the ideal and optimum gradient waveforms;
a means for adjusting the read resonance signals in accordance with the difference between the ideal and optimum gradient waveforms;
a means for reconstructing the adjusted magnetic resonance signals and converting them to an image representation of an interior of the subject.

19. A magnetic resonance imaging apparatus comprising:
- a means for receiving a subject in a main magnetic field of a magnetic resonance apparatus;
- a means for constructing an optimum gradient waveform including:
  - a means for submitting scan preferences to the apparatus from a user;
  - a means for choosing an ideal gradient waveform based on the scan preferences;
  - a means for digitizing the ideal waveform; and,
  - a means for convolving the digitized ideal waveform with a band-limited kernel representing a frequency spectrum of a gradient amplifier;
- a means for exciting magnetic resonance and receiving magnetic resonance signals;
- a means for applying the optimum gradient waveform with a gradient amplifier during a resonance signal read portion of an imaging sequence;
- a means for reconstructing the read magnetic resonance signals and converting them to an image representation of an interior of the subject.

20. The apparatus as set forth in claim 18, wherein the means for converting the ideal gradient waveform into the optimum gradient waveform includes:
- a means for selecting an imaging sequence which includes at least a radio frequency magnetic field pulse, an ideal read gradient pulse, and at least one other gradient pulse;
- a means for sampling a selected read gradient at intervals to generate a series of gradient values;
- a means for convolving the selected gradient values with a preselected band-limited kernel which represents a frequency response spectrum of a gradient amplifier that applies the read gradient to generate a modified optimal read gradient waveform.

21. The apparatus as set forth in claim 20, further including:
- a means for selecting a plurality of imaging sequences;
- a means for sampling the read gradients from each of the sequences to generate a series of gradient values;
- a means for convolving the gradient values with the preselected band-limited kernel to generate a plurality of modified read gradient waveforms;
- a means for storing the modified read gradient waveforms;
- a means for accessing the stored read gradient waveforms when applying a selected imaging sequence.

22. The apparatus as set forth in claim 18, wherein the means for converting the ideal gradient waveform into the optimum gradient waveform includes:
- a means for storing digital values of a model ideal gradient waveform in a model waveform archive;
- a means for modeling a frequency response spectrum to a gradient amplifier with a kernel generator to generate a kernel representing the frequency response spectrum of the gradient amplifier;
- a means for storing the gradient amplifier spectrum kernel in a spectrum kernel memory;
- a means for convolving the digitized gradient waveform with the band limited kernel to generate an optimized gradient waveform.

23. The method as set forth in claim 15, wherein the step of band limiting the gradient waveform includes:
- storing digital values of a model gradient waveform in a model waveform archive;
- modeling a frequency response spectrum to the gradient amplifier with a kernel generator to generate a kernel representing a frequency response spectrum of the gradient amplifier;
- storing the gradient amplifier spectrum kernel in a spectrum kernel memory;
- convolving the digitized gradient waveform with the band-limited kernel to generate an optimized gradient waveform.

24. A magnetic resonance method comprising:
- storing digital values of a model gradient waveform in a model waveform archive;
- modeling a frequency response spectrum to a gradient amplifier with a kernel generator to generate a kernel representing a frequency response spectrum of the gradient amplifier;
- storing the gradient amplifier spectrum kernel in a spectrum kernel memory;
- convolving the digitized gradient waveform with the band-limited kernel to generate an optimized gradient waveform.

* * * * *